(12) United States Patent
Chang et al.

(10) Patent No.: US 7,577,418 B2
(45) Date of Patent: Aug. 18, 2009

(54) SUB-HARMONIC MIXER AND DOWN CONVERTER WITH THE SAME

(75) Inventors: Jen-Chung Chang, Taoyuar County (TW); Chia-Jung Hsu, Hsinchu (TW); Shey-Shi Lu, Taipei (TW); Hsiao-Chin Chen, Hsinchu (TW); Tzu-Chao Lin, Kaohsiung (TW)

(73) Assignees: United Microelectronics Corp., Hsinchu (TW); National Taiwan University, Taipei (TW)

( * ) Notice: Subject to any disclaimer, the term of this patent is extended or adjusted under 35 U.S.C. 154(b) by 433 days.

(21) Appl. No.: 11/458,190

(22) Filed: Jul. 18, 2006

(65) Prior Publication Data

US 2008/0032659 A1 Feb. 7, 2008

(51) Int. Cl.
*H04B 1/26* (2006.01)
(52) U.S. Cl. .................. 455/323; 455/324; 455/326; 327/102; 327/359; 327/119
(58) Field of Classification Search .................. 455/424, 455/425, 456.5, 456.6, 561, 550.1, 575.1, 455/118, 189.1, 190.1, 205, 258, 318, 323, 455/324, 326, 147, 333, 285, 302, 319, 313; 327/359, 116, 113, 119, 102, 103, 264, 101, 327/356, 355, 361; 332/146, 117, 138, 130, 332/119, 116; 375/332, 281, 269, 324, 316
See application file for complete search history.

(56) References Cited

U.S. PATENT DOCUMENTS

| | | | |
|---|---|---|---|
| 4,429,418 A | | 1/1984 | Hooper |
| 5,303,417 A | * | 4/1994 | Laws ........................ 455/314 |
| 5,530,929 A | * | 6/1996 | Lindqvist et al. ............ 455/324 |
| 6,026,286 A | * | 2/2000 | Long .......................... 455/327 |
| 6,029,060 A | * | 2/2000 | Ashby ........................ 455/326 |
| 6,094,084 A | * | 7/2000 | Abou-Allam et al. ....... 327/359 |
| 6,239,645 B1 | * | 5/2001 | Tsukahara et al. .......... 327/359 |
| 6,308,058 B1 | * | 10/2001 | Souetinov et al. ........... 455/326 |
| 6,437,631 B2 | * | 8/2002 | Amano ....................... 327/359 |
| 6,675,003 B1 | | 1/2004 | Dubash et al. |
| 6,725,029 B1 | | 4/2004 | Allen |

(Continued)

OTHER PUBLICATIONS

Jointly authored by Zhang et al., Article title "A 900MHz CMOS Balanced Harmonic Mixer for Direct Conversion Receivers", IEEE Rawcon, pp. 219-222, Sep. 2000.

(Continued)

*Primary Examiner*—Duc Nguyen
*Assistant Examiner*—Charles Chow
(74) *Attorney, Agent, or Firm*—J.C. Patents (57) ABSTRACT

A sub-harmonic mixer and a down converter with the sub-harmonic mixer are provided. The sub-harmonic mixer includes a differential amplifying unit, a current buffer unit, and a switching unit. The differential amplifying unit is used to amplify a radio frequency (RF) signal and employs a first resonance circuit to force a leakage signal to flow to a first voltage. The current buffer unit is used to amplify the gain of an output signal of the differential amplifying unit and employs a second resonance circuit to force the leakage signal to flow to a second voltage. Finally, the switching unit switches an output signal of the current buffer unit into a base band signal.

17 Claims, 9 Drawing Sheets

U.S. PATENT DOCUMENTS

| | | | |
|---|---|---|---|
| 6,738,611 | B1 | 5/2004 | Politi |
| 6,810,242 | B2 | 10/2004 | Molnar et al. |
| 6,861,891 | B2 | 3/2005 | Romano |
| 6,871,057 | B2 * | 3/2005 | Ugajin et al. ............... 455/323 |
| 6,919,851 | B2 | 7/2005 | Rogers et al. |
| 7,062,247 | B2 * | 6/2006 | Kovacevic et al. .......... 455/323 |
| 7,236,763 | B2 * | 6/2007 | Heck .......................... 455/323 |
| 2004/0097211 | A1 | 5/2004 | Dubash et al. |
| 2004/0106391 | A1 | 6/2004 | Romano |
| 2005/0233723 | A1 * | 10/2005 | Gomez et al. ............... 455/323 |
| 2006/0003717 | A1 | 1/2006 | Sowlati |
| 2006/0022740 | A1 * | 2/2006 | Kim et al. .................... 327/359 |
| 2006/0246861 | A1 * | 11/2006 | Dosanjh et al. ............. 455/147 |
| 2007/0072575 | A1 * | 3/2007 | Sowlati et al. .............. 455/318 |
| 2007/0087721 | A1 * | 4/2007 | Park et al. ................... 455/333 |
| 2007/0218850 | A1 * | 9/2007 | Pan .......................... 455/189.1 |
| 2007/0242779 | A1 * | 10/2007 | Choi et al. .................. 375/332 |
| 2007/0264959 | A1 * | 11/2007 | Carrez ........................ 455/323 |

OTHER PUBLICATIONS

Jointly authored by Yamaji, et al., Article title "An I/Q Active Balanced Harmonic Mixer with IM2 Cancelers and a 45° Phase Shifter", IEEE Journal of Solid-State Circuits, vol. 33, No. 12,pp. 2240-2246, Dec. 1998.

Jointly authored by Abou-Allam, et al., Article title "Low-Voltage 1.9-GHz Front-End Receiver in 0.5-µm CMOS Technology", IEEE Journal of Solid-State Circuits, vol. 36, No. 10, pp. 1434-1443, Oct. 2001.

Jointly authored by Koh, et al., Article title "Subharmonically Pumped CMOS Frequency Conversion (Up and Down) Circuits for 2-GHz WCDMA Direct-Conversion Transceiver", IEEE Journal of Solid-State Circuits, vol. 39, No. 6, pp. 871-884, Jun. 2004.

Jointly authored by Svitek, et al., Article title "5-6 GHz SiGe Active I/Q Subharmonic Mixers With Power Supply Noise Effect Characterization", IEEE Microwave and Wireless Components Letters, vol. 14, No. 7, Pates 319-321, Jul. 2004.

* cited by examiner

| | PRESENT EMBODIMENT | PERIODICAL [1] | PERIODICAL [2] | PERIODICAL [3] | PERIODICAL [4] |
|---|---|---|---|---|---|
| PROCESS TECHNOLOGY | CMOS | BiCMOS | CMOS | SiGe | CMOS |
| SUPPLY VOLTAGE (V) | 1.0 | 2.7 | 3.0 | 3.3 | 1.8 |
| POWER (mW) | 13.6 | N.A. | 5.2 | 16.5 | 12.1 |
| FREQUENCY OF THE RF SIGNAL (GHz) | 5.2 | 1.9 | 0.9 | 5.2 | 2.0 |
| GAIN (dB) | 12.9 | 27.0 | 13.0 | 6 | 20 |
| NOISE FIGURE (dB) | 17.3 | 14.0 | 24.5 | N.A. | 8.5 |
| IP3 (dBm) | 2.8 | -4.0 | -10.6 | 4.6 | 4* |
| IP2 (dBm) | 45.9 | 37.0 | 35.7 | 29.0 | 41 |
| LOR (dB) | 35.5 | N.A. | 37.5 | N.A. | N.A. |
| LO LEAKAGE (dBm) | -65.2 | N.A. | -59.4+ | -55 | -57.0 |
| 2LO LEAKAGE (dBm) | -101.9 | N.A. | N.A. | -60 | N.A. |
| DC OFFSET (dBm) | -100.7 | -97.0 | -96.9+ | N.A. | N.A. |

SUB-HARMONIC MIXER AND DOWN CONVERTER WITH THE SAME

BACKGROUND OF THE INVENTION

1. Field of Invention

The present invention relates to a mixer. More particularly, the present invention relates to a sub-harmonic mixer having LC-folded cascode.

2. Description of Related Art

A direct-conversion receiver (or homodyne receiver) uses one time down conversion operation in its structure for directly converting a radio frequency (RF) signal into a base band signal, so it is also called zero-IF receiver. The frequency of the poly-phase local oscillation (LO) signal produced by such receiver is very close to the frequency of the RF signal, thus, image noise interference can be avoided, and no image rejection filter is required to be disposed before mixing the RF signal and the poly-phase LO signal because of the disappearance of image noise. Accordingly, compared to other receiver structures such as a superheterodyne receiver, a direct-conversion receiver has the advantages such as simple structure and single chip, and is being adopted more and more in today's transceivers.

Even though the direct-conversion receiver has the foregoing advantages, the structure thereof still has some disadvantages. For example, DC offset is one of the problems thereof. The production of DC offset is mainly because that the isolation between the input terminal (here referred to as input terminal of RF signal) of the mixer and the low noise amplifier (LNA) and the input terminal of the mixer for receiving the poly-phase LO signal is not infinite, thus, when the poly-phase LO signal appears at the input terminal of RF signal due to feedthrough effect, the poly-phase LO signal will be self-mixed with the original poly-phase LO signal and further the DC offset will be produced. In addition, the problem of even-order distortion should be noted too because the direct-conversion receiver does not have an image rejection filter before mixing the signals, so that the even-order distortion produced by non-linear circuit may also be directly transmitted to the output of the mixer along with the disturbing signal around the RF signal through feedthrough effect, so that the RF signal to be received originally may be further affected.

Figure 1:
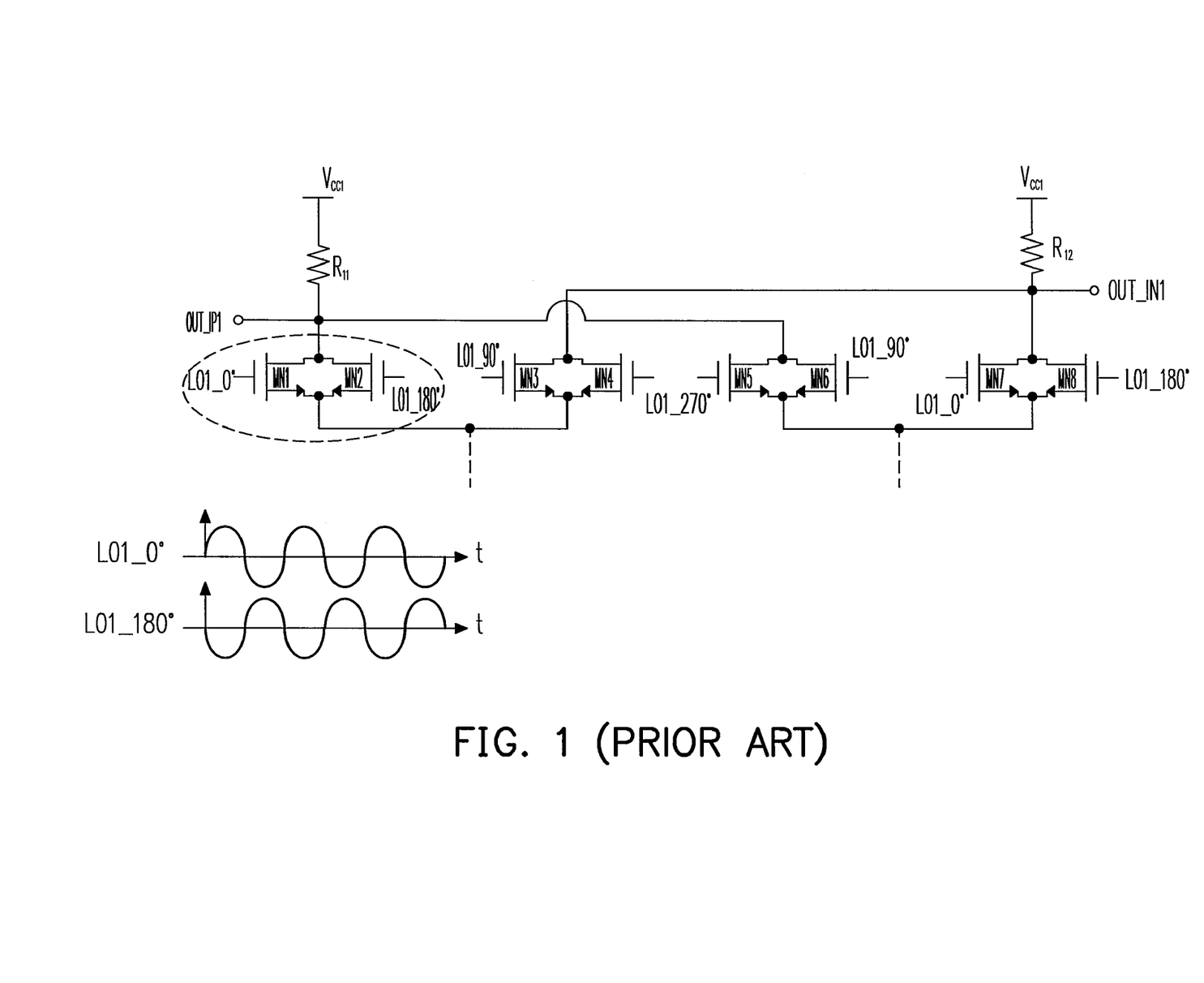
FIG. 1 is a diagram illustrating the structure of a conventional sub-harmonic mixer.
Figure 2:
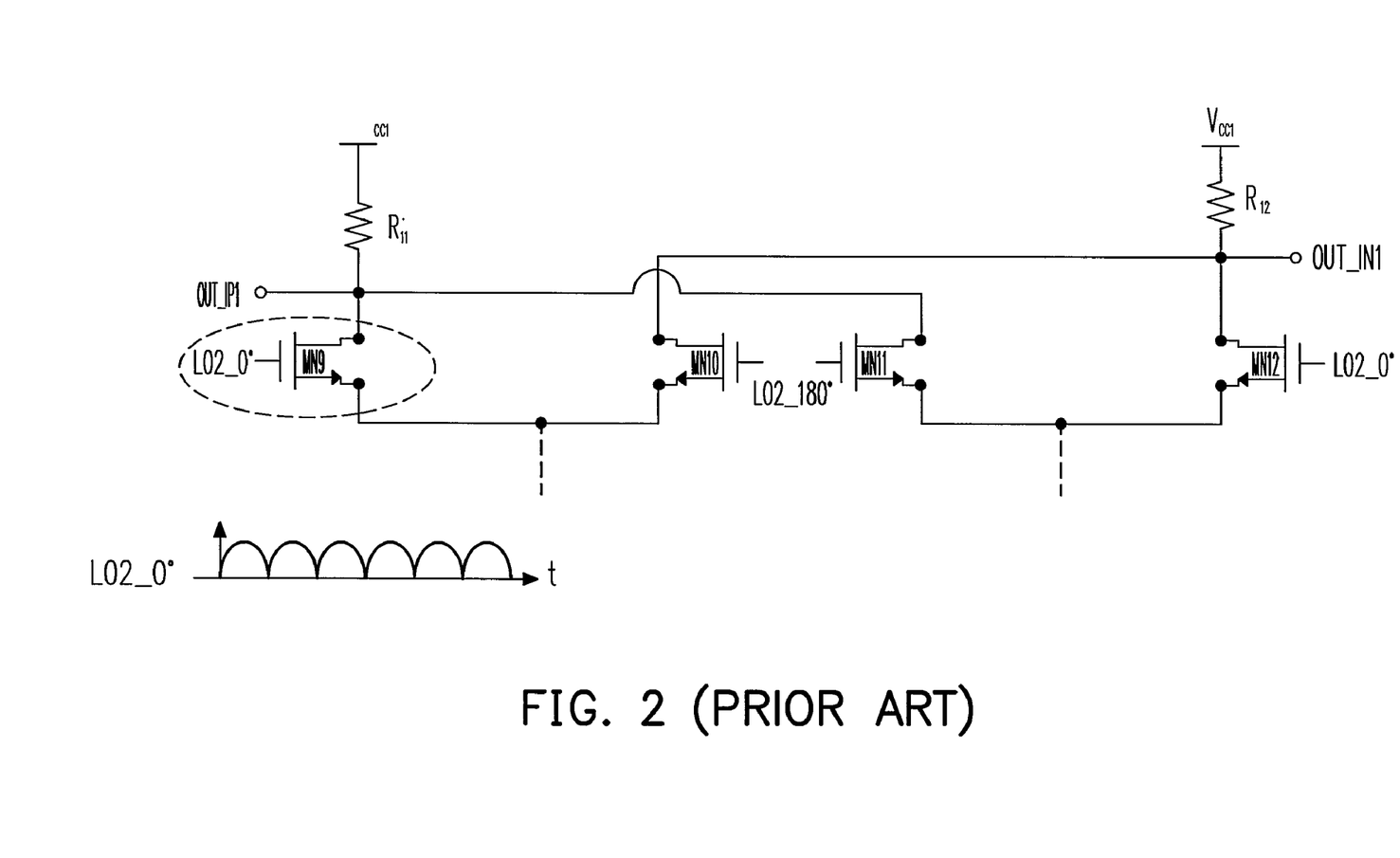
FIG. 2 is a diagram illustrating the structure of a conventional Gilbert mixer.

To resolve the aforementioned problems, the direct-conversion receiver adopts the conventional sub-harmonic mixer (SHM) as shown in FIG. 1 for providing ideal isolation to the input terminals of the poly-phase LO signal and the RF signal. The conventional SHM is derived from Gilbert mixer as shown in FIG. 2. Referring to FIG. 1 and FIG. 2, wherein the poly-phase LO signal includes local oscillation signals LO1_0°~LO1_270° which respectively have phase shifts of 0°, 90°, 180°, and 270°, and the poly-phase local oscillation signal LO2 includes local oscillation signals LO2_0° and LO2_180° which respectively have phase shifts 0° and 180°. If each of the N-type transistors MN9~MN12 in Gilbert mixer is replaced with two N-type transistors connected in parallel, and the frequency provided to the poly-phase LO signal LO2 of the Gilbert mixer is reduced to 0.5 time of the original frequency, so as to form the poly-phase LO signal LO1 received by NMOS transistors connected in parallel and accordingly the conventional SHM in FIG. 1. For example, replace MN9 with MN1 and MN2, and the frequencies with phase difference 180° of LO signals LO1_0° and LO1_180° received by MN1 and MN2 is 2 times of that of the LO signal LO2_0° received by MN9. Accordingly, the direct-conversion receiver with conventional SHM can operate the frequency of the poly-phase LO signal at 0.5 times of the frequency of the RF signal, and can also maintain the ideal isolation of Gilbert mixer.

However, in the actual monolithic process, the isolation provided by the conventional SHM is always affected due to unsymmetrical circuit caused by mismatching components. Thus, how to improve the isolation of the input terminal of a conventional SHM by using original circuit structure, so as to reduce the leakage signal of the poly-phase LO signal and even-order distortion caused by disturbing signal at the input terminal of the RF signal, has become the biggest challenge in the application of direct-conversion receiver.

SUMMARY OF THE INVENTION

Accordingly, the present invention is directed to provide a sub-harmonic mixer (SHM), wherein a leakage signal is oriented to a first voltage or a second voltage by a resonance circuit so that the SHM can have very good isolation, and the problems of DC offset and even-order distortion in the application of direct-conversion receiver which uses SHM can be resolved.

According to another aspect of the present invention, a down converter is provided, wherein the self-mixing and even-order distortion caused by leakage signal are reduced, and the performance of the down converter is improved by adopting the excellent isolation of the SHM.

To achieve the aforementioned and other objectives, the present invention provides an SHM for mixing a poly-phase local oscillation (LO) signal and a radio frequency (RF) signal so as to produce a base band signal. The SHM includes a differential amplifying unit, a current buffer unit, and a switching unit. The differential amplifying unit amplifies the RF signal. The current buffer unit is coupled to the differential amplifying unit for amplifying the gain of the output signal of the differential amplifying unit. The switching unit is coupled to the current buffer unit for switching the output signal of the current buffer unit to the base band signal based on the poly-phase LO signal.

According to an exemplary embodiment of the present invention, the differential amplifying unit includes a first resonance circuit, and the current buffer unit includes a second resonance circuit. To mix the poly-phase LO signal and the RF signal for producing the base band signal, the following steps are included. First, the differential amplifying unit amplifies the RF signal, and the amplified RF signal is oriented to the current buffer unit by the first resonance circuit; meanwhile, the leakage signal produced by the local resonance signal is oriented to the first voltage by the first resonance circuit. Next, the current buffer unit coupled to the differential amplifying unit amplifies the gate of the output signal of the differential amplifying unit and orients the output signal of the current buffer unit to the switching unit by using the second resonance circuit; meanwhile, the second resonance circuit also orients the leakage signal produced by the local resonance signal to the second voltage. Finally, the switching unit switches the output signal of the current buffer unit to a base band signal based on the poly-phase LO signal.

The resonance frequencies of the foregoing first resonance circuit and second resonance circuit are the same as the frequency of the RF signal. The first voltage is an supply voltage, and the second voltage is a ground voltage.

According to an exemplary embodiment, the SHM can be applied to a direct-conversion receiver.

According to yet another aspect of the present invention, a down converter is provided, which is used for converting a RF signal into a base band signal. The down converter includes a signal producer and an SHM. Wherein the SHM includes a differential amplifying unit, a current buffer unit, and a switching unit. The signal producer is used for providing a poly-phase LO signal. The SHM coupled to the signal producer is used for mixing the poly-phase LO signal and a RF signal to produce a base band signal. Wherein, the procedure of the SHM producing the base band signal includes: the differential amplifying unit amplifying the RF signal; next, the current buffer unit coupled to the differential amplifying unit amplifying the gate of the output signal of the differential amplifying unit; finally, the output signal of the current buffer unit being converted into the base band signal by using the switching unit coupled to the current buffer unit and the signal producer based on the poly-phase LO signal. Accordingly, the down converter can achieve the purpose of converting a RF signal into a base band signal.

According to the down converter in an exemplary embodiment, the signal producer includes a local oscillator and a phase shifter. The local oscillator is used for producing a LO signal so that the phase shifter connected in series between the local oscillator and the switching unit can convert the LO signal into a plurality of LO signals of different offsets to be output as poly-phase LO signals.

According to an exemplary embodiment, the down converter can be applied to a direct-conversion receiver.

According to the present invention, the structure combining a differential amplifying unit and a current buffer unit is adopted, so that the SHM can use a first resonance circuit and a second resonance circuit to orient the leakage signal to a first voltage or a second voltage. Accordingly, along with the increase of the isolation of the SHM, the DC offset and the even-order distortion in the direct-conversion receiver using the SHM can be considerably reduced.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 3:
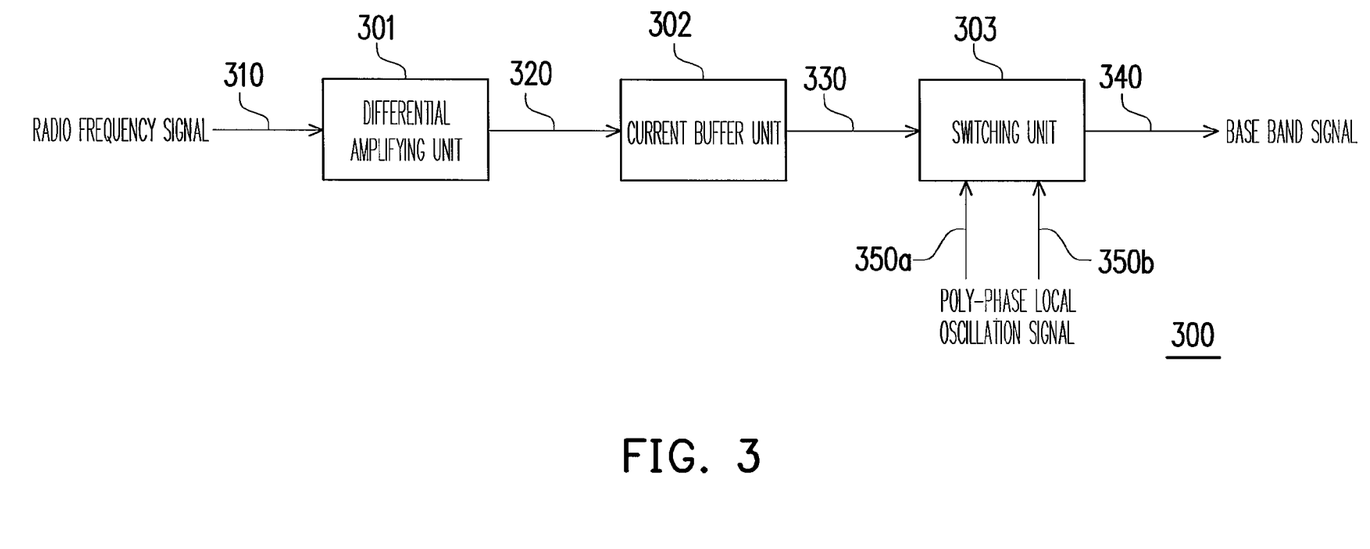
FIG. 3 is a diagram illustrating the structure of a sub-harmonic mixer according to an exemplary embodiment of the present invention.

FIG. 3 is a diagram illustrating the structure of a sub-harmonic mixer (SHM) according to an exemplary embodiment of the present invention, which includes a differential amplifying unit 301, a current buffer unit 302, and a switching unit 303. The current buffer unit 302 is coupled between the differential amplifying unit 301 and the switching unit 303. After the differential amplifying unit 301 amplifying the radio frequency (RF) signal, the SHM 300 amplifies the gain of the output signal of the differential amplifying unit 301 by using the current buffer unit 302, so that the switching unit 303 switches the output signal of the current buffer unit 302 to a base band signal based on the poly-phase local oscillation (LO) signal. Accordingly, the SHM 300 can mix the poly-phase LO signal and the RF signal to produce the base band signal.

Figure 4:
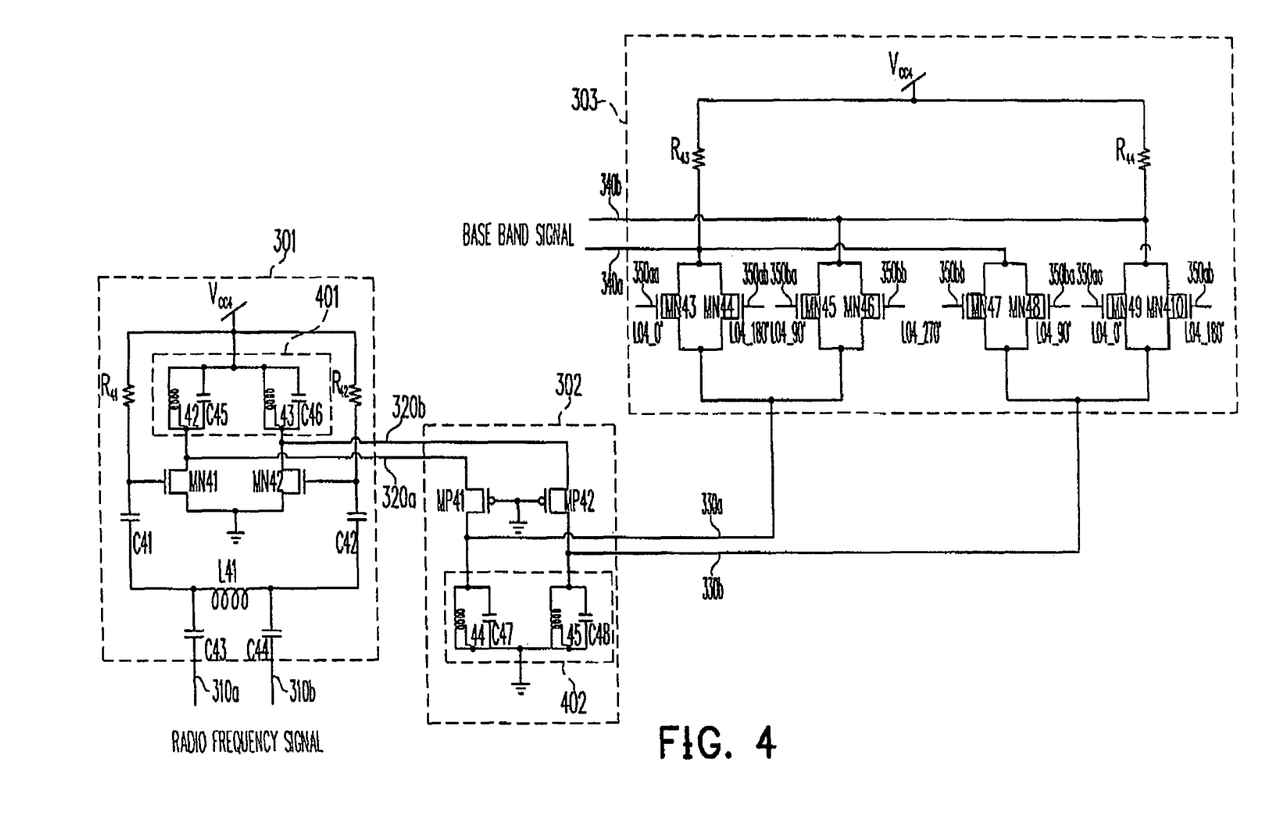
FIG. 4 is a detailed circuit diagram of a sub-harmonic mixer according to an exemplary embodiment of the present invention.

FIG. 4 is a detailed circuit diagram of a sub-harmonic mixer according to an exemplary embodiment of the present invention. Referring to FIG. 3, the input terminals 310a and 310b correspond to the differential input terminal 310 of the differential amplifying unit 301 in FIG. 3. The output terminals 320a and 320b correspond to the differential output terminal 320 of the differential amplifying unit 301 in FIG. 3. The output terminals 330a and 330b correspond to the differential output terminal 330 of the current buffer unit 302 in FIG. 3. The output terminals 340a and 340b correspond to the differential output terminal 340 of the switching unit 303 in FIG. 3. The input terminals 350aa and 350ab, and the input terminals 350ba and 350bb correspond to the input terminal 350a and 350b of the poly-phase LO signal of the switching unit 303 in FIG. 3.

As shown in FIG. 4, the differential amplifying unit 301 includes a resonance circuit 401, N-type transistors MN41 and MN42, resistors R41 and R42, capacitors C41 and C42, and an inductance L41. The current buffer unit 302 includes P-type transistors MP41 and MP42, and a resonance circuit 402. The switching unit 303 includes N-type transistors MN43~MN410 and resistors R43 and R44. The first terminals of the resistors R41 and R42 are coupled to a first voltage (for example, the supply voltage $V_{CC4}$). The drains of the N-type transistors MN41 and MN42 are coupled to the resonance circuit 401, the sources of the N-type transistors MP41 and MP42 are coupled to a second voltage (for example the ground voltage), and the gates of the N-type transistors MP41 and MP42 are respectively coupled to the first terminals of the capacitors C41 and C42. The inductance L41 is connected in series between the second terminal of the capacitor C41 and the second terminal of the capacitor C42. The first terminals of the capacitors C43 and C44 are respectively coupled to the first terminal and the second terminal of the inductance L41, and the second terminals of the capacitors C43 and C44 are respectively wired to form the input terminals 310a and 310b. The sources of the P-type transistors MP41 and MP42 are respectively coupled to the drains of the N-type transistors MP41 and MP42, and the gates of the P-type transistors MP41 and MP42 are coupled to a second voltage. The resonance circuit 402 is connected in series between the gates of the P-type transistors MP41 and MP42 and the second voltage. The first terminal of the resistors R43 and R44 are coupled to the first voltage, and the second terminals of the resistors R43 and R44 are respectively wired to form the output terminals 340a and 340b. The drains of the N-type transistors MN43 and MN44 and the N-type transistors MN47 and MN48 are coupled to the second terminal of the resistor R43. The drains of the N-type transistors MN45 and MN46, MN49 and MN410 are coupled to the second terminal of the resistor R44. The sources of the N-type transistors MN43~MN46 are coupled to the drain of the P-type transistor MP41. The sources of the N-type transistors MN47~MN410 are coupled to the drain of the P-type transistor MP42.

The resonance circuit 401 includes inductances L42 and L43 and capacitors C45 and C46. The resonance circuit 402 includes inductances L44 and L45 and capacitors C47 and C48. The first terminals of the inductances L42 and L43 and capacitors C45 and C46 are coupled to a first voltage. The second terminals of the inductances L42 and the capacitor C45 are coupled to the drains of the N-type transistor MN41. The second terminals of the inductance L43 and the capacitor C46 are coupled to the drain of the N-type transistor MN42. The first terminals of the inductance L44 and the capacitor C47 are coupled to the drain of the P-type transistor MP41. The first terminals of the inductance L45 and the capacitor C48 are coupled to the drain of the P-type transistor MP42. The second terminals of the inductances L44 and L45 and the second terminals of the capacitors C47 and C48 are coupled to the second voltage.

Please refer to FIG. 4 again for the operation principle of the present embodiment. The inductances L42 and L43 in the differential amplifying unit 301 provide a low impedance path to form the DC bias currents of the N-type transistors MN41 and MN42. Here, the RF signal received by the second terminals of the capacitor C43 and C44 is amplified by the N-type transistors MN41 and MN42 which are equivalent to differential transconductance in their operation. In the present embodiment, to transmit the amplified RF signal to the current buffer unit 302 through the output terminals 320a and 320b, the resonance frequency of the resonance circuit 401 is operated at the frequency of the RF signal. Since the resonance circuit 401 operated at the resonance frequency is equivalent to a high impedance, thus, the amplified RF signal can be oriented to the current buffer unit 302. Moreover, since the frequency of the poly-phase LO signal of the sub-harmonic mixer 300 is 0.5 times of the frequency of the RF signal, thus, the leakage signal produced when the poly-phase LO signal appears at the input terminals 310a and 310b through feedthrough effect, or the even-order distortion produced by the disturbing signal through non-linear circuit are also oriented to the first voltage by the resonance circuit 401.

Next, the current buffer unit 302 receives the amplified RF signal by using the sources of the P-type transistors MP41 and MP42. The inductances L44 and L45 provide low impedance path to form the DC bias current of the P-type transistors MP41 and MP42. Here, the P-type transistors MP41 and MP42 connected in common gate can not only improve the isolation of the current buffer unit 302, but also amplify the gain of the output signal of the differential amplifying unit 301. To orient the RF signal amplified by P-type transistors MP41 and MP42 to the switching unit 303, the resonance circuit 402 adopts the same method as the resonance circuit 401 to operate the resonance frequency at the frequency of the RF signal, so that the output signal of the current buffer unit 302 is oriented to the switching unit 303. Meanwhile, the resonance circuit 402 may also orient the leakage signal produced when the poly-phase LO signal at the input terminals 310a and 310b, or the even-order distortion produced by the disturbing signal through non-linear circuit to the second voltage.

Finally, the LO signals LO4_0°, LO4_90°, LO4_180°, and LO4_270° included in the poly-phase LO signal are respectively received by the gates of the N-type transistors MN43 and MN49, the gates of the N-type transistors MN45 and MN48, the gates of the N-type transistors MN 44 and MN410, and the gates of the N-type transistors MN 46 and MN47 in the switching unit 303. Here, the N-type transistors MN43~MN410, which has operation characteristics of switches, switch the output signal of the current buffer unit 302 to the base band signal based on the LO signals LO4_0°, LO4_90°, LO4_180° and LO4_270°. Wherein, the phase shifts of the LO signals LO4_0°, LO4_90°, LO4_180°, and LO4_270° are respectively 0 degree, 90 degree, 180 degree, and 270 degree.

Figure 5:
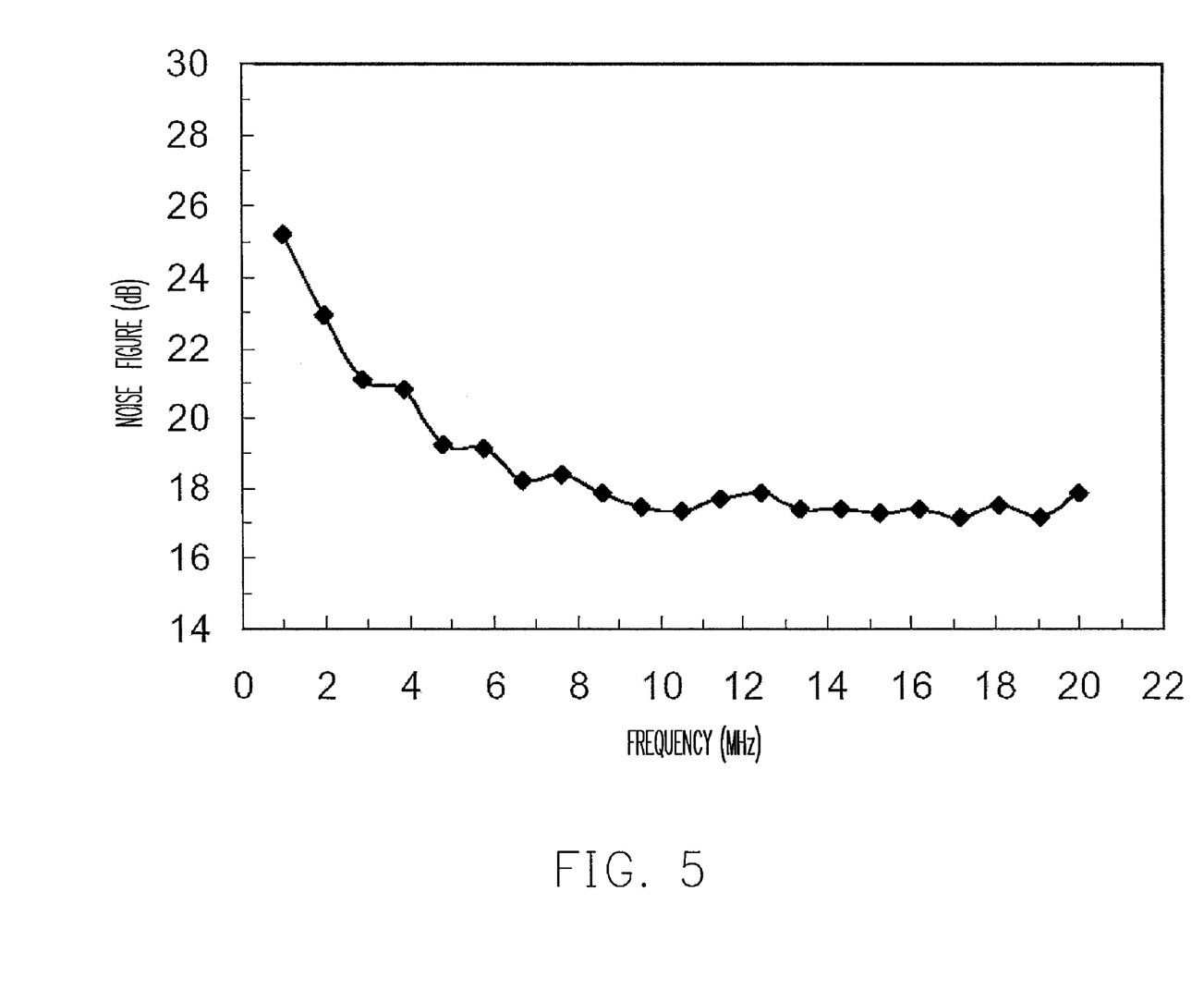
FIGS. 5~7 illustrate the actual measurement results of the circuit characteristics in the embodiment of FIG. 4.
Figure 6:
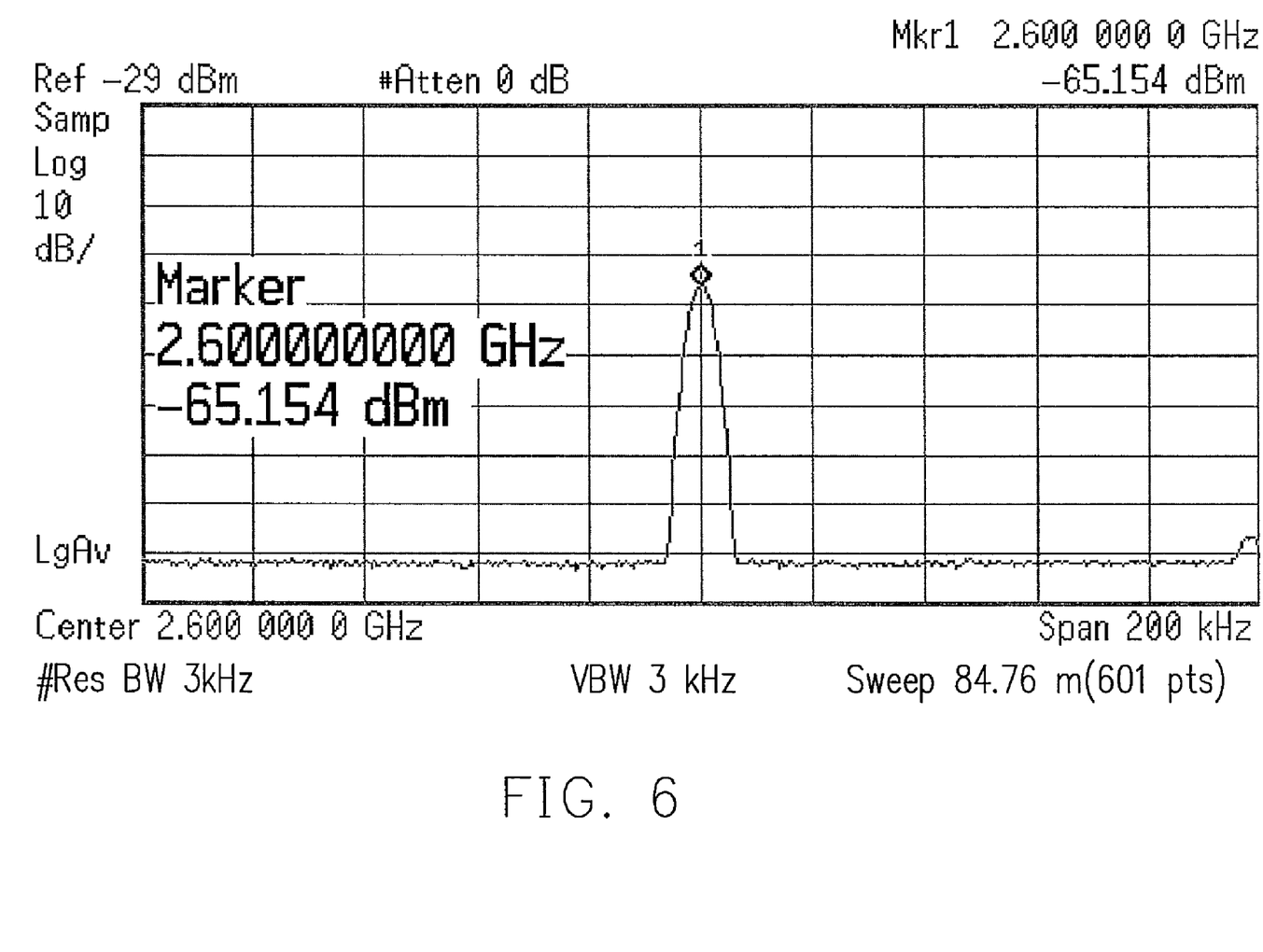
Figure 7:
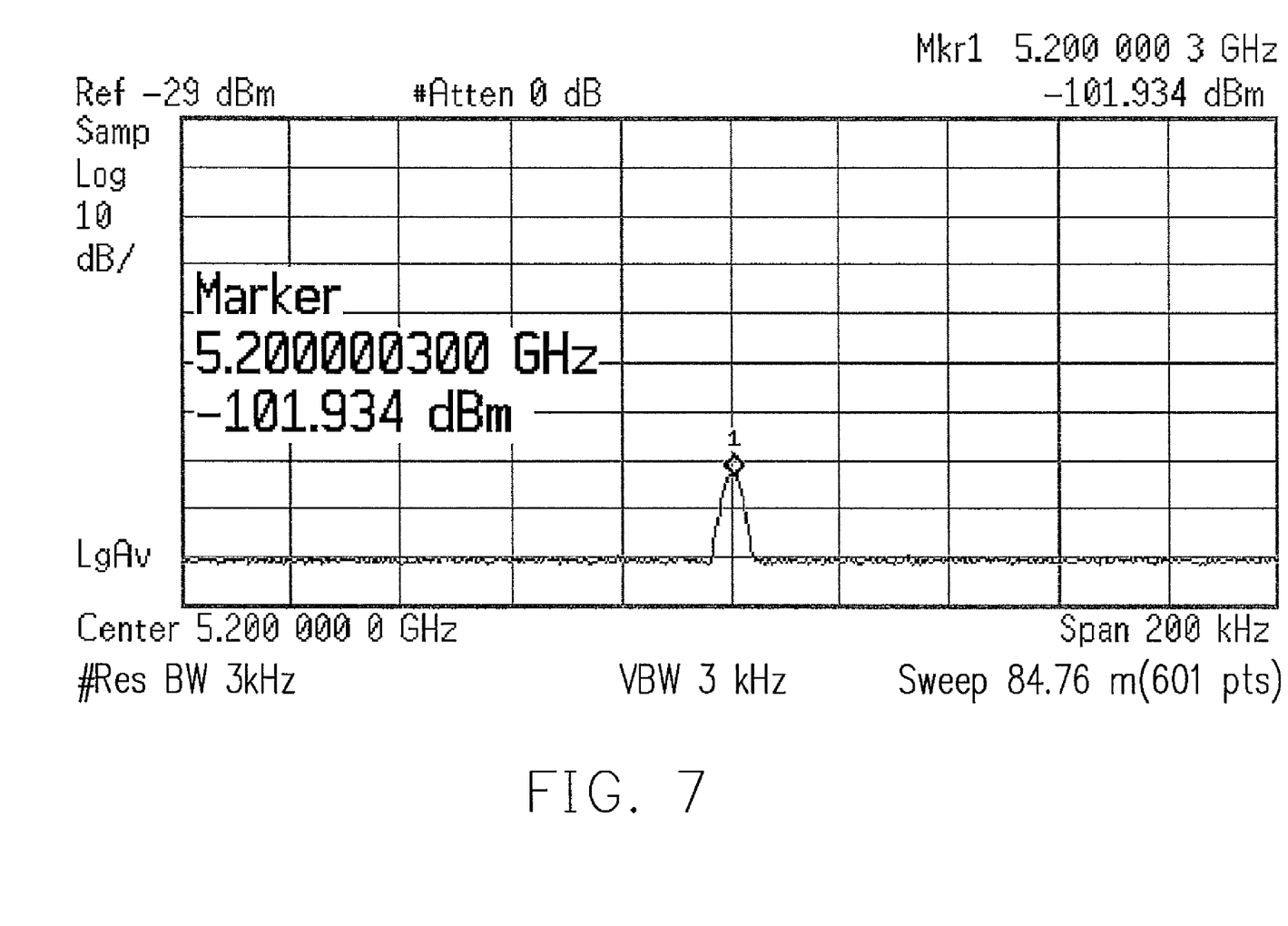
Figure 8:
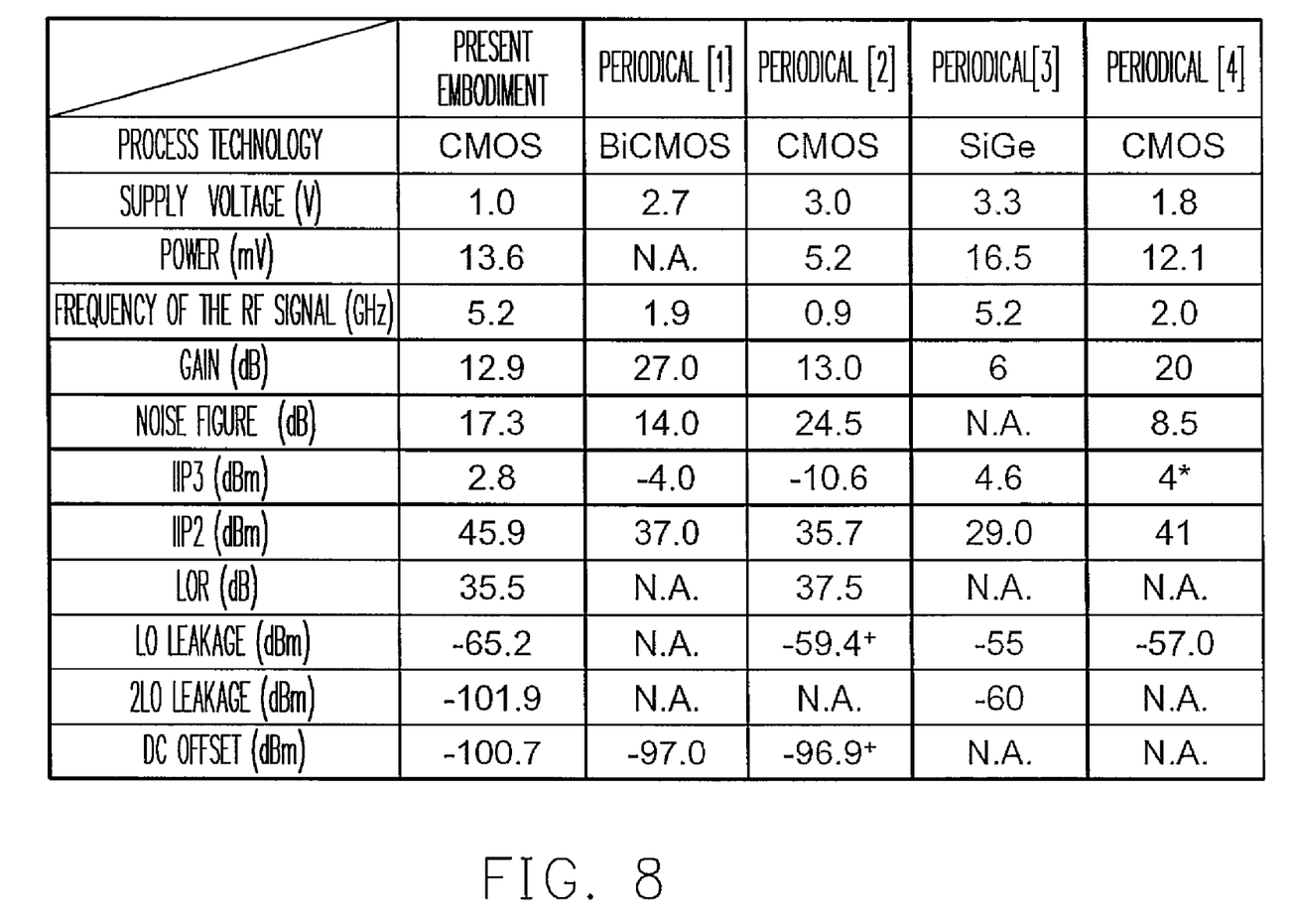
FIG. 8 is a comparison table between the related characteristics of the embodiment in FIG. 4 and existing periodicals.

FIGS. 5~8 illustrate the actual measurement results of the present embodiment implemented in existing CMOS process. In the present embodiment, the supply voltage $V_{CC4}$ is 1V, the frequency of the RF signal is 5.2 GHz, and the frequency of the poly-phase local signal is 2.6 GHz. As shown in FIG. 5, the noise figure of the SHM 300 when the frequency thereof is 10 MHz is 17.3 dB. As shown in FIG. 6, the SHM 300 detects a leakage signal of −65.154 dBm at the input terminals 310a and 310b when the receiving frequency of the poly-phase local signal is 15.5 dBm. The leakage signal will cause DC offset of about −100.7 dBm to the output frequency of the SHM 300, however, the DC offset does not exceed the noise floor specified by a WLAN receiver. In other words, here the DC offset caused by the SHM 300 is covered up in the noise floor and will not affect the performance of the circuit. In addition, as shown in FIG. 7, only very slim 2 times leakage signal (the frequency thereof is only −101.934 dBm) is detected at the input terminals 310a and 310b of the SHM 300, which proves that the input terminal of the SHM 300 in the present invention has excellent isolation. To further understand the circuit performance of the present invention, FIG. 8 illustrates the comparison results between the present embodiment and the periodical released in Solid-state Circuits, VOL. 33, No. 12, 1988 (denoted as periodical[1] in FIG. 8), the periodical released in RAWCON, pp. 219-222, 2000 (denoted as periodical[2] in FIG. 8), the periodical released in Microwave and Wireless Components Letters, VOL. 14, No. 7, 2004 (denoted as periodical[3] in FIG. 8), and the periodical released in Solid-state Circuits, VOL. 39, No. 6, 2004 (denoted as periodical[4] in FIG. 8) by IEEE (Institute of Electrical and Electronic Engineers). It can be understood from FIG. 8 that the SHM in the present invention has excellent isolation, thus compared to the articles issued in existing periodicals, the present invention has better characteristics at the input $3^{rd}$ order intercept point (IIP3), the input $2^{nd}$ order intercept point (IIP2), LOR (local oscillator rejection), or regarding the leakage signal and DC offset. Wherein, the annotation with symbol "*" in FIG. 8 represents that the SHM released in the periodical has linear circuit, and symbol "+" represents that the isolation of the input terminal of the RF signal is assumed to be 50 dB in the SHM released in the periodical.

Figure 9:
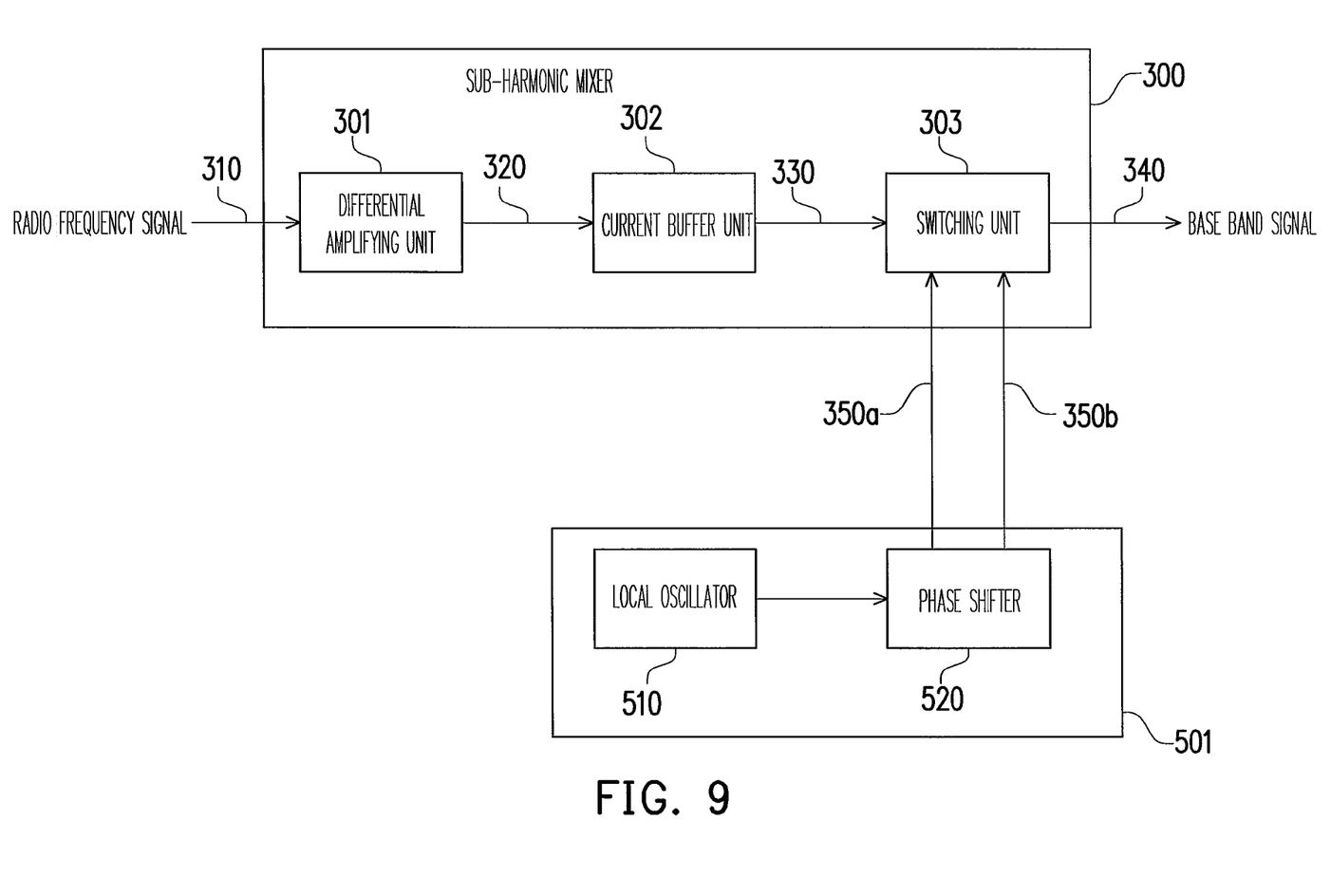
FIG. 9 is a diagram illustrating the structure of a down converter according to an exemplary embodiment of the present invention.

FIG. 9 is a diagram illustrating the structure of a down converter according to an exemplary embodiment of the present invention. The down converter includes an SHM 300 and a signal producer 501. The SHM 300 includes a differential amplifying unit 301, a current buffer unit 302, and a switching unit 303. Wherein, the SHM 300 is coupled to the signal producer 501. The current buffer unit 302 is coupled to the differential amplifying unit 301. The switching unit 303 is coupled to the current buffer unit 302 and the signal producer 501. The procedure of the down converter converting the RF signal to the base band signal includes: first, amplifying the received RF signal by using the differential amplifying unit 301; next, amplifying the gain of the output signal of the differential amplifying unit 301 by using the current buffer unit 302. Accordingly, the switching unit 303 converts the output signal of the current buffer unit 302 into a base band signal based on the poly-phase LO signal provided by the signal producer 501.

The foregoing signal producer 501 includes a local oscillator 510 and a phase shifter 520. The phase shifter 520 is connected between the local oscillator 510 and the switching unit 303. Wherein, the local oscillator 510 is used for producing LO signal, so that the phase shifter 520 converts the received LO signal into a plurality of LO signals of different phase shifts to be output as poly-phase LO signals. In the embodiment in FIG. 9, the operation theory, circuit structure, and related circuit characteristics of the SHM 300 are included in the embodiments in FIGS. 3~8 so the details will not be described again here.

In overview, in the present invention, the structure combining the differential amplifying unit and current buffer unit is adopted, so that the isolation of the SHM can be effectively improved when the SHM orients the leakage signal to the first voltage and the second voltage by using the first resonance circuit and the second resonance circuit. Accordingly, the circuit performances of related circuits which have to use SHM, such as down converter, direct-conversion receiver etc, can be greatly improved along with the increase of the isolation of the SHM. In particular, to direct-conversion receiver, the DC offset and even-order distortion thereof can be considerably reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A sub-harmonic mixer, used for mixing a poly-phase local oscillation (LO) signal and a radio frequency (RF) signal to produce a base band signal, the sub-harmonic mixer comprising:
    a differential amplifying unit, amplifying the RF signal;
    a current buffer unit, coupled to the differential amplifying unit for gaining the output signal of the differential amplifying unit; and
    a switching unit, coupled to the current buffer unit, switching the output signal of the current buffer unit to the base band signal based on the poly-phase LO signal,
    wherein the differential amplifying unit comprises:
        a first resonance circuit, coupled to an supply voltage for orienting the amplified RF signal to the current buffer unit and orienting a leakage signal to the supply voltage;
        a first resistor, the first terminal of the first resistor being directly coupled to the supply voltage;
        a second resistor, the first terminal of the second resistor being directly coupled to the supply voltage;
        a first N-type transistor, the drain of the first N-type transistor being coupled to the first resonance circuit, the gate of the first N-type transistor being coupled to the second terminal of the first resistor, and the source of the first N-type transistor being coupled to a ground voltage;
        a second N-type transistor, the drain of the second N-type transistor being coupled to the first resonance circuit, the gate of the second N-type transistor being coupled to the second terminal of the second resistor, and the source of the second N-type transistor being coupled to the ground voltage;
        a first capacitor, the first terminal of the first capacitor being coupled to the gate of the first N-type transistor;
        a second capacitor, the first terminal of the second capacitor being coupled to the gate of the second N-type transistor;
        a first inductance, the first terminal of the first inductance being coupled to the second terminal of the first capacitor, and the second terminal of the first inductance being coupled to the second terminal of the second capacitor;
        a third capacitor, the first terminal of the third capacitor being coupled to the first terminal of the first inductance, and the second terminal of the third capacitor being used for receiving the RF signal; and
        a fourth capacitor, the first terminal of the fourth capacitor being coupled to the second terminal of the first inductance, and the second terminal of the fourth capacitor being used for receiving the RF signal; and
    the current buffer unit comprises:
        a first P-type transistor, the source of the first P-type transistor being coupled to the drain of the first N-type transistor, and the gate of the first P-type transistor being coupled to the ground voltage;
        a second P-type transistor, the source of the second P-type transistor being coupled to the drain of the second N-type transistor, and the gate of the second P-type transistor being coupled to the ground voltage; and
        a second resonance circuit, connected in series between the drains of first P-type transistor and the ground voltage, and between the drains of second P-type transistor and the ground voltage, for orienting the output signal of the current buffer unit to the switching unit and orienting the leakage signal to the ground voltage.

2. The sub-harmonic mixer as claimed in claim 1 is suitable to be applied to a direct-conversion receiver.

3. The sub-harmonic mixer as claimed in claim 1, wherein the first resonance circuit comprises:
    a second inductance, the first terminal of the second inductance being coupled to the supply voltage, and the second terminal of the second inductance being coupled to the drain of the first N-type transistor;
    a fifth capacitor, the first terminal of the fifth capacitor being coupled to the supply voltage, and the second terminal of the fifth capacitor being coupled to the drain of the first N-type transistor;
    a third inductance, the first terminal of the third inductance being coupled to the supply voltage, and the second terminal of the third inductance being coupled to the drain of the second N-type transistor; and
    a sixth capacitor, the first terminal of the sixth capacitor being coupled to the supply voltage, and the second terminal of the sixth capacitor being coupled to the drain of the second N-type transistor.

4. The sub-harmonic mixer as claimed in claim 1, wherein the resonance frequency of the first resonance circuit is the same as the frequency of the RF signal.

5. The sub-harmonic mixer as claimed in claim 1, wherein the second resonance circuit comprises:
    a fourth inductance, the first terminal of the fourth inductance being coupled to the drain of the first P-type transistor, and the second terminal of the fourth inductance being coupled to the ground voltage;
    a seventh capacitor, the first terminal of the seventh capacitor being coupled to the drain of the first P-type transistor, and the second terminal of the seventh capacitor being coupled to the ground voltage;

a fifth inductance, the first terminal of the fifth inductance being coupled to the drain of the second P-type transistor, and the second terminal of the fifth inductance being coupled to the ground voltage; and an eighth capacitor, the first terminal of the eighth capacitor being coupled to the drain of the second P-type transistor, and the second terminal of the eighth capacitor being coupled to the ground voltage.

6. The sub-harmonic mixer as claimed in claim 1, wherein the resonance frequency of the second resonance circuit is the same as the frequency of the RF signal.

7. The sub-harmonic mixer as claimed in claim 1, wherein the poly-phase LO signal comprises the first to the fourth local oscillation (LO) signals, the switching unit comprises:

a third resistor, the first terminal of the third resistor being coupled to the supply voltage;

a fourth resistor, the first terminal of the fourth resistor being coupled to the supply voltage;

a third N-type transistor, the drain of the third N-type transistor being coupled to the second terminal of the third resistor, the source of the third N-type transistor being coupled to the drain of the first P-type transistor, and the gate of the third N-type transistor being used for receiving the first LO signal;

a fourth N-type transistor, the drain of the fourth N-type transistor being coupled to the second terminal of the third resistor, the source of the fourth N-type transistor being coupled to the drain of the first P-type transistor, and the gate of the fourth N-type transistor being used for receiving the third LO signal;

a fifth N-type transistor, the drain of the fifth N-type transistor being coupled to the second terminal of the fourth resistor, the source of the fifth N-type transistor being coupled to the drain of the first P-type transistor, and the gate of the fifth N-type transistor being used for receiving the second LO signal;

a sixth N-type transistor, the drain of the sixth N-type transistor being coupled to the second terminal of the fourth resistor, the source of the sixth N-type transistor being coupled to the drain of the first P-type transistor, and the gate of the sixth N-type transistor being used for receiving the fourth LO signal;

a seventh N-type transistor, the drain of the seventh N-type transistor being coupled to the second terminal of the third resistor, the source of the seventh N-type transistor being coupled to the drain of the second P-type transistor, and the gate of the seventh N-type transistor being used for receiving the fourth LO signal;

an eighth N-type transistor, the drain of the eighth N-type transistor being coupled to the second terminal of the third resistor, the source of the eighth N-type transistor being coupled to the drain of the second P-type transistor, and the gate of the eighth N-type transistor being used for receiving the second LO signal;

a ninth N-type transistor, the drain of the ninth N-type transistor being coupled to the second terminal of the fourth resistor, the source of the ninth N-type transistor being coupled to the drain of the second P-type transistor, and the gate of the ninth N-type transistor being used for receiving the first LO signal; and a tenth N-type transistor, the drain of the tenth N-type transistor being coupled to the second terminal of the fourth resistor, the source of the tenth N-type transistor being coupled to the drain of the second P-type transistor, and the gate of the tenth N-type transistor being used for receiving the third LO signal.

8. The sub-harmonic mixer as claimed in claim 7, wherein the frequencies of the first to the fourth LO signals are respectively 0.5 times of the frequency of the RF signal, and the phase shifts of the first to the fourth LO signals are respectively 0 degree, 90 degree, 180 degree, and 270 degree.

9. A down converter, used for converting a radio frequency (RF) signal to a base band signal, the down converter comprising:

a signal producer, used for providing a poly-phase local oscillation (LO) signal; and a sub-harmonic mixer, coupled to the signal producer for mixing the poly-phase LO signal and the RF signal to produce the base band signal, the sub-harmonic mixer comprising:

a differential amplifying unit, used for amplifying the RF signal;

a current buffer unit, coupled to the differential amplifying unit, used for gaining the output signal of the differential amplifying unit; and a switching unit, coupled to the current buffer unit and the signal producer, used for switching the output signal of the current buffer unit to the base band signal based on the poly-phase LO signal, wherein the differential amplifying unit comprises:

a first resonance circuit, coupled to an supply voltage, used for orienting the amplified RE signal to the current buffer unit;

a first resistor, the first terminal of the first resistor being directly coupled to the supply voltage;

a second resistor, the first terminal of the second resistor being directly coupled to the supply voltage;

a first N-type transistor, the drain of the first N-type transistor being coupled to the first resonance circuit, the gate of the first N-type transistor being coupled to the second terminal of the first resistor, and the source of the first N-type transistor being coupled to a ground voltage;

a second N-type transistor, the drain of the second N-type transistor being coupled to the first resonance circuit, the gate of the second N-type transistor being coupled to the second terminal of the second resistor, and the source of the second N-type transistor being coupled to the ground voltage;

a first capacitor, the first terminal of the first capacitor being coupled to the gate of the first N-type transistor;

a second capacitor, the first terminal of the second capacitor being coupled to the gate of the second N-type transistor;

a first inductance, the first terminal of the first inductance being coupled to the second terminal of the first capacitor, and the second terminal of the first inductance being coupled to the second terminal of the second capacitor;

a third capacitor, the first terminal of the third capacitor being coupled to the first terminal of the first inductance, and the second terminal of the third capacitor being used for receiving the RF signal; and a fourth capacitor, the first terminal of the fourth capacitor being coupled to the second terminal of the first inductance, and the second terminal of the fourth capacitor being used for receiving the RF signal; and the current buffer unit comprises:

a first P-type transistor, the source of the first P-type transistor being coupled to the drain of the first N-type transistor, and the gate of the first P-type transistor being coupled to the ground voltage;

a second P-type transistor, the source of the second P-type transistor being coupled to the drain of the second N-type transistor, and the gate of the second P-type transistor being coupled to the ground voltage; and a second resonance circuit, connected in series between the drains of the first P-type transistor and the ground voltage, and between the drains of second P-type transistor and the ground voltage, used for orienting the output signal of the current buffer unit to the switching unit.

10. The down converter as claimed in claim 9, wherein the signal producer comprises:

a local oscillator, used for producing a local oscillation signal; and a phase shifter, connected in series between the local oscillator and the switching unit, used for converting the local oscillation signal into a plurality of local oscillation (LO) signals of different phase shifts to be output as the poly-phase LO signals.

11. The down converter as claimed in claim 9 is suitable to be applied to a direct-conversion receiver.

12. The down converter as claimed in claim 9, wherein the first resonance circuit comprises:

a second inductance, the first terminal of the second inductance being coupled to the supply voltage, and the second terminal of the second inductance being coupled to the drain of the first N-type transistor;

a fifth capacitor, the first terminal of the fifth capacitor being coupled to the supply voltage, and the second terminal of the fifth capacitor being coupled to the drain of the first N-type transistor;

a third inductance, the first terminal of the first inductance being coupled to the supply voltage, and the second terminal of the third inductance being coupled to the drain of the second N-type transistor; and a sixth capacitor, the first terminal of the sixth capacitor being coupled to the supply voltage, and the second terminal of the sixth capacitor being coupled to the drain of the second N-type transistor.

13. The down converter as claimed in claim 9, wherein the resonance frequency of the first resonance circuit is the same as the frequency of the RF signal.

14. The down converter as claimed in claim 9, wherein the second resonance circuit comprises:

a fourth inductance, the first terminal of the fourth inductance being coupled to the drain of the first P-type transistor, and the second terminal of the fourth inductance being coupled to the ground voltage;

a seventh capacitor, the first terminal of the seventh capacitor being coupled to the drain of the first P-type transistor, and the second terminal of the seventh capacitor being coupled to the ground voltage;

a fifth inductance, the first terminal of the fifth inductance being coupled to the drain of the second P-type transistor, and the second terminal of the fifth inductance being coupled to the ground voltage; and an eighth capacitor, the first terminal of the eighth capacitor being coupled to the drain of the second P-type transistor, and the second terminal of the eighth capacitor being coupled to the ground voltage.

15. The down converter as claimed in claim 9, wherein resonance frequency of the second resonance circuit is the same as the frequency of the RF signal.

16. The down converter as claimed in claim 9, wherein the poly-phase LO signal comprises the first to the fourth LO signals, the switching unit comprising:

a third resistor, the first terminal of the third resistor being coupled to the supply voltage;

a fourth resistor, the first terminal of the fourth resistor being coupled to the supply voltage;

a third N-type transistor, the drain of the third N-type transistor being coupled to the second terminal of the third resistor, the source of the third N-type transistor being coupled to the drain of the first P-type transistor, and the gate of the third N-type transistor being used for receiving the first LO signal;

a fourth N-type transistor, the drain of the fourth N-type transistor being coupled to the second terminal of the third resistor, the source of the fourth N-type transistor being coupled to the drain of the first P-type transistor, and the gate of the fourth N-type transistor being used for receiving the third LO signal;

a fifth N-type transistor, the drain of the fifth N-type transistor being coupled to the second terminal of the fourth resistor, the source of the fifth N-type transistor being coupled to the drain of the first P-type transistor, and the gate of the fifth N-type transistor being used for receiving the second LO signal;

a sixth N-type transistor, the drain of the sixth N-type transistor being coupled to the second terminal of the fourth resistor, the source of the sixth N-type transistor being coupled to the drain of the first P-type transistor, and the gate of the sixth N-type transistor being used for receiving the fourth LO signal;

a seventh N-type transistor, the drain of the seventh N-type transistor being coupled to the second terminal of the third resistor, the source of the seventh N-type transistor being coupled to the drain of the second P-type transistor, and the gate of the seventh N-type transistor being used for receiving the fourth LO signal;

an eighth N-type transistor, the drain of the eighth N-type transistor being coupled to the second terminal of the third resistor, the source of the eighth N-type transistor being coupled to the drain of the second P-type transistor, and the gate of the eighth N-type transistor being used for receiving the second LO signal;

a ninth N-type transistor, the drain of the ninth N-type transistor being coupled to the second terminal of the fourth resistor, the source of the ninth N-type transistor being coupled to the drain of the second P-type transistor, and the gate of the ninth N-type transistor being used for receiving the first LO signal; and a tenth N-type transistor, the drain of the tenth N-type transistor being coupled to the second terminal of the fourth resistor, the source of the tenth N-type transistor being coupled to the drain of the second P-type transistor, and the gate of the tenth N-type transistor being used for receiving the third LO signal.

17. The down converter as claimed in claim 16, wherein the frequencies of the first to the fourth LO signals are respectively 0.5 times of the frequency of the RF signal, and the phase shifts of the first to the fourth LO signals are respectively 0 degree, 90 degree, 180 degree, and 270 degree.

* * * * *